(12) United States Patent
Chi et al.

(10) Patent No.: US 12,094,873 B2
(45) Date of Patent: Sep. 17, 2024

(54) SIGE HBT WITH GRAPHENE EXTRINSIC BASE AND METHODS

(71) Applicant: SiEn (QingDao) Integrated Circuits Co., Ltd., Shandong (CN)

(72) Inventors: Min-Hwa Chi, Qingdao (CN); Richard Ru-Gin Chang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 409 days.

(21) Appl. No.: 17/516,658

(22) Filed: Nov. 1, 2021

(65) Prior Publication Data

US 2022/0208756 A1 Jun. 30, 2022

(30) Foreign Application Priority Data

Dec. 28, 2020 (CN) .......................... 202011579597.1

(51) Int. Cl.
*H01L 27/06* (2006.01)
*H01L 21/8249* (2006.01)
*H01L 29/66* (2006.01)
*H01L 29/737* (2006.01)

(52) U.S. Cl.
CPC ...... *H01L 27/0635* (2013.01); *H01L 21/8249* (2013.01); *H01L 29/66242* (2013.01); *H01L 29/7371* (2013.01)

(58) Field of Classification Search
CPC ............. H01L 27/0635; H01L 21/8249; H01L 29/66242; H01L 29/7371; H01L 27/0623; H01L 29/0821; H01L 29/1606; H01L 29/7378; H01L 29/165; H01L 29/1004; H01L 29/66272
See application file for complete search history.

(56) References Cited

U.S. PATENT DOCUMENTS

| | | | | |
|---|---|---|---|---|
| 5,015,594 A | * | 5/1991 | Chu | ..................... H01L 21/8249 257/E21.507 |
| 5,321,301 A | * | 6/1994 | Sato | ..................... H01L 29/1004 257/589 |
| 2002/0185657 A1 | * | 12/2002 | Chantre | .............. H01L 29/7378 257/E29.193 |
| 2012/0068157 A1 | * | 3/2012 | Kub | ..................... H01L 29/7376 977/734 |
| 2018/0197781 A1 | * | 7/2018 | Chevalier | ........... H01L 29/0821 |

* cited by examiner

*Primary Examiner* — Syed I Gheyas
(74) *Attorney, Agent, or Firm* — Chen Yoshimura LLP

(57) ABSTRACT

The present application provides methods for manufacturing BiCMOS device and the heterojunction bipolar transistor (HBT) contained therein. In formation of a raised extrinsic base region of the heterojunction bipolar transistor, the epitaxial silicon is doped with carbon (C) and boron (B) in situ and is doped with a metal catalyst simultaneously, then, the plasma treatment and the laser annealing are conducted to the carbon, and a graphene region is formed in the Si epitaxial layer. Because of high conductivity of graphene, the base resistance of the SiGe HBT can be reduced to enhance its radiation performance. The above method can be applied to conventional BiCMOS device process by performing plasma treatment and laser annealing to the doped carbon to form the graphene region in the extrinsic base region. The method is easily controlled and integrated into conventional BiCMOS device process.

15 Claims, 5 Drawing Sheets

SIGE HBT WITH GRAPHENE EXTRINSIC BASE AND METHODS

BACKGROUND OF THE INVENTION

1. Field of the Invention

The present invention relates to a technical field of a semiconductor device, and more particularly to a BiCMOS device, a heterojunction bipolar transistor (HBT) contained therein and manufacturing method thereof.

2. Description of the Related Art

Conventional vertical bipolar transistor (VBT) is the key technology for high-performance computer. Its features include: 1) polysilicon emitter, in which the base width can be scaled to below 100 nm; 2) self-aligned emitter-base and isolation of deep, shallow trenches, which are able to reduce device size as well as capacitance; and 3) self-aligned heavier doped intrinsic collector region to further increase speed. Currently, heterojunction bipolar transistors (HBT) integrated with complementary metal oxide semiconductor field effect transistors (referred to as BiCMOS) technology is broadly applied to automotive radars, high-speed wireless and optical data links, and high-precision analog circuits.

The structure of HBT is similar to that of conventional VBT, except that a small amount of carbon (C)-doped silicon-germanium (SiGe) is used instead of Si in the base. Advanced CMOS technology and SiGe BiCMOS technology may be a solution of the future 5G communication standard up to 40 GHz frequency, which is a strong contender for high data rate wireless or optical fiber backhaul.

However, the base resistance of the SiGe HBT is an important factor for its performance at high operation frequency. In order to obtain a SiGe HBT with good performance at high operation frequency, the base resistance of the SiGe HBT has to be reduced.

SUMMARY

Considering the needs of reduction of the base resistance of SiGe HBT, the present application provides a method for manufacturing a BiCMOS device and a heterojunction bipolar transistor (HBT) contained therein. In the present application, in formation of a raised non-intrinsic (or extrinsic) base region of the heterojunction bipolar transistor, the epitaxial silicon is doped with carbon (C) and boron (B) in situ as well as with a metal catalyst simultaneously, then, a plasma treatment and followed by laser annealing steps are conducted to form highly conductive graphene regions in the Si epitaxial layer. Because of good mobility of graphene, the base resistance of the SiGe HBT can be reduced to enhance its performance at high operation frequency.

To practice the above purpose and other relevant purposes, the present application provides a method for manufacturing heterojunction bipolar transistors (HBT) integrated with CMOS circuits (i.e. BiCMOS) comprising the following steps:

providing a substrate comprising a CMOS device region and a HBT device region;

forming well regions in the substrate, wherein the neighboring well regions are isolated by a shallow trench;

forming a collector region of a first conductivity type above the well region in the HBT device region;

forming an intrinsic base region of a second conductivity type above the collector region;

forming an emitter region of the first conductivity type above the intrinsic base region; and forming a raised non-intrinsic (or extrinsic) base region of the second conductivity type on both sides of the emitter region, wherein the extrinsic base region contains graphene regions formed therein.

In one embodiment, the step of forming the collector region of the first conductivity type above the well region in the HBT device region further comprises the following steps:

etching a hard mask layer on a surface of the substrate in the HBT device region to form the collector region window;

forming an epitaxial silicon layer in the collector region window;

forming an ion implantation window above the epitaxial silicon layer; and conducting n-type (P31) ion implantation into the epitaxial silicon layer via the ion implantation window to form a self-aligned doped collector region.

In one embodiment, the step of forming the emitter region of the first conductivity type above the intrinsic base region further comprises the following steps:

forming a mask layer above the intrinsic base region;

patterning the mask layer to form an emitter region window; and performing an epitaxial growth of doped silicon via the emitter region window to form the emitter region.

In one embodiment, the step of performing an epitaxial growth of doped silicon via the emitter region window further comprises: performing in-situ arsenic (As) doping while performing the epitaxial growth of silicon via the emitter region window.

In one embodiment, the step of forming the intrinsic base region above the collector region comprises:

forming a silicon buffer layer and a silicon-germanium (SiGe) layer above the collector region;

performing in-situ carbon (C) and boron (B) doping to the SiGe layer; and forming a silicon cap layer above the SiGe layer.

In one embodiment, the step of forming the raised extrinsic base region of the second conductivity type on both sides of the emitter region comprises the following step:

performing a selective epitaxial Silicon Germanium (SiGe) growth on both sides of the emitter region;

doping C and B in-situ to the silicon layer;

performing a plasma treatment to the doped silicon layer;

performing a laser annealing to the doped silicon layer; and forming the graphene regions in the silicon layer.

In one embodiment, the silicon layer is also doped in-situ with a metal catalyst—together with the in-situ doping of C and B.

In one embodiment, the carbon has a doping concentration less than 10% and the boron has a doping concentration less than 5%.

In one embodiment, the metal catalyst is titanium (Ti) or zirconium (Zr), and the metal catalyst has a concentration less than 3%.

In one embodiment, the laser annealing temperature is higher than 700° C.

In one embodiment, a MOS device is formed in the CMOS device region.

According to another concept of the present application, a BiCMOS device is provided. The BiCMOS device comprises:

a substrate comprising a CMOS device region and a HBT device region;

well regions formed in the substrate, wherein the neighboring well regions are isolated by a shallow trench;

a heterojunction bipolar transistor (HBT) formed in the HBT device region, wherein the heterojunction bipolar transistor comprises:

a collector region of a first conductivity type located above the well region of the first conductivity type of the HBT device region;

an intrinsic base region of a second conductivity type located above the collector region;

an emitter region of the first conductive type located above the intrinsic base region;

a raised extrinsic base region of the first conductive type on both sides of the emitter region, wherein the extrinsic base region contains a graphene region formed therein.

In one embodiment, the collector region comprises an epitaxial silicon layer and a self-aligned doped collector region formed in the epitaxial silicon layer.

In one embodiment, the intrinsic base region comprises a silicon buffer layer, a C-doped SiGe layer and a silicon cap layer formed above the collector region.

In one embodiment, the emitter region is As-doped silicon layer.

In one embodiment, the BiCMOS device further comprises: a MOS device formed in the CMOS device region.

According to the above, the method for manufacturing a HBT in BiCMOS device of the present application has at least the following advantages:

In the present application, in formation of a raised extrinsic base region of the heterojunction bipolar transistor, the epitaxial silicon is doped with C and B in situ and is also doped with a metal catalyst simultaneously, then, the plasma treatment and the laser annealing are performed to the carbon, and graphene regions are formed in the Si epitaxial layer. Because of highly conductive graphene, the base resistance of the SiGe HBT can be reduced to enhance its performance at high operation frequency. The above method can be applied to conventional BiCMOS device process by performing plasma treatment and laser annealing to the doped carbon to form the graphene regions in the extrinsic base region. The method is easily controlled and is able to be integrated into conventional BiCMOS device process.

The heterojunction bipolar transistor formed by the above method has the extrinsic base region comprising the graphene regions with better conductivity, so that the smaller base resistance can be obtained and the better performance at high operation frequency of the heterojunction bipolar transistor can be achieved.

DETAILED DESCRIPTION OF THE EMBODIMENTS

Figure 1:
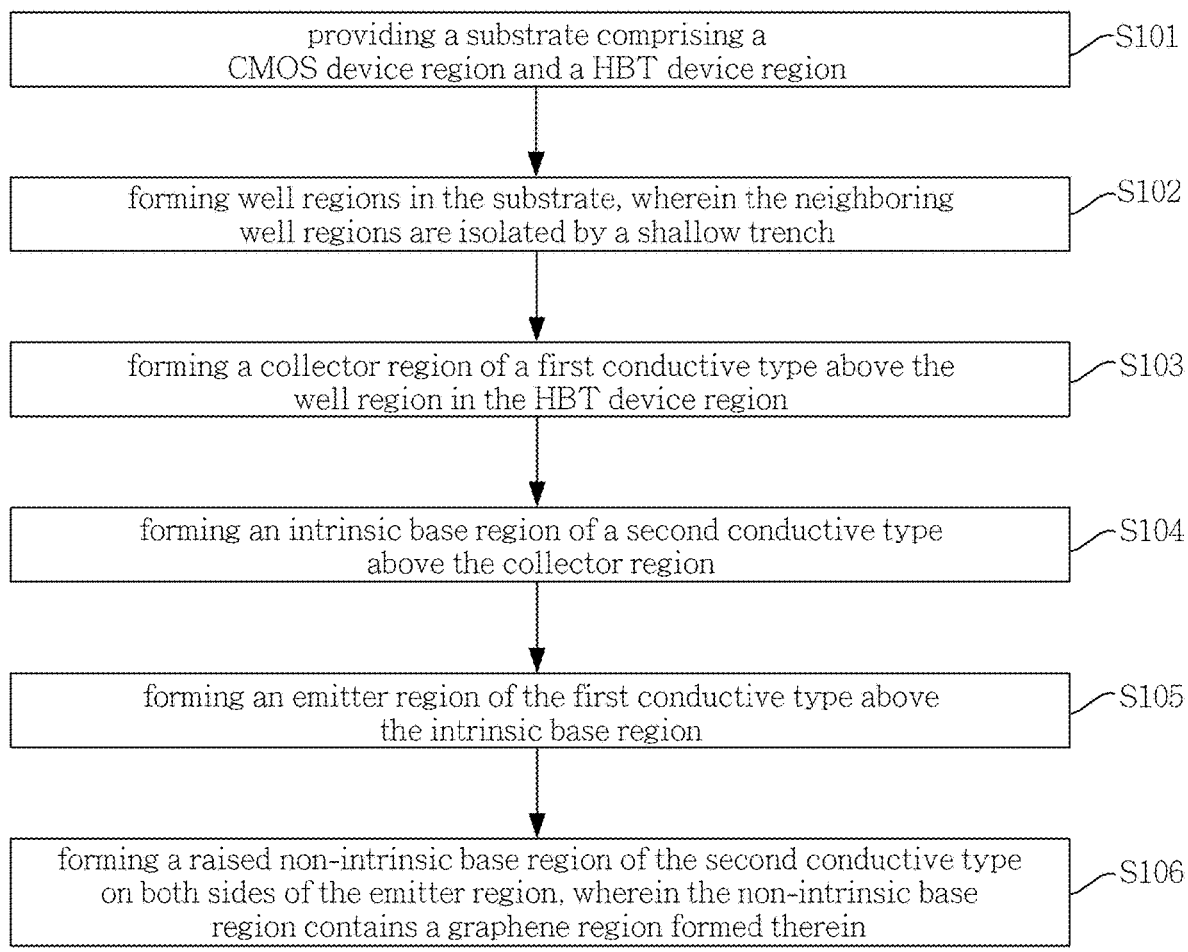
FIG. 1 is a flowchart illustrating method steps for manufacturing a heterojunction bipolar transistor according to Example 1 of the present application.

The preferred embodiments are described in detail below to explain the present application. A person having ordinary skills in the art is able to easily understand other advantages and effects based on the disclosure of the specification. The present application may have other embodiments in addition to the detailed description. Various details in this specification can be modified or changed based on different viewpoints and applications without departing from the spirit of the present invention It should be noted that the drawings provided in embodiments are merely illustrative for the concepts of the present invention, so that only the components related to the present invention are shown in the drawings but not the actual number, shape and size of components. In practice, the type, number and ratio of each component can be changed randomly, and the layout or type of components may be more complex.

EXAMPLES

Example 1

Graphene is an allotrope of carbon, which is a single atomic layer of carbon connected by $sp^2$ hybridized bonds. Various researches to graphene are conducted because of its unique electric, thermal and mechanical properties. An important application of graphene is as a potential substitute for tin-doped indium oxide (ITO) to be the next generation of large-scaled transparent conductive electrodes (TCE). One special advantage of use of graphene, assuming its flawless, is the extremely high electron mobility due to its unique two-dimensional electron gas under room temperature. The conventional process to grow large-area graphene is chemical vapor deposition (CVD). However, this process requires a deposition temperature of about 1000° C., and the formed graphene film needs to be transferred to a specific substrate, resulting in the significant increase of cost of graphene manufacture. In order to overcome the above limits, the recent study is to grow graphene via plasma treatment at 600° C. to amorphous carbon ($\alpha$-C), so that further research on principles of graphitization of $\alpha$-C is critical for manufacturing high-quality graphene. In 2013, Barreiro et al. reported the catalyst-free growth of graphene from amorphous carbon ($\alpha$-C) by current-induced annealing by witnessing the mechanism both with in-situ transmission electron microscopy and with molecular dynamics simulations. At the same time, $\alpha$-C clusters is simulated. It is exciting to observe long fibers constituted by these clusters under high temperature. These clusters with fibers can be the carbon source and repair defects on graphene sheet.

Based on the excellent electrical properties of graphene, this example provides a method for manufacturing a heterojunction bipolar transistor in a BiCMOS device, in which an extrinsic base region comprising a graphene region can be formed in the heterojunction bipolar transistor. Thereby, the base resistance is reduced while the performance at high frequency of the device can be enhanced. As shown in FIG. 1, the method comprises the following steps.

Step S101: providing a substrate comprising a CMOS device region and a HBT device region.

Step S102: forming well regions in the substrate, wherein the neighboring well regions are isolated by a shallow trench.

Figure 2:
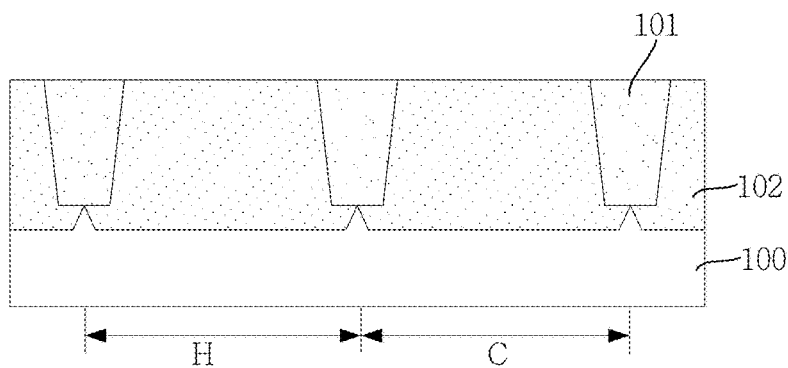
FIG. 2 shows a substrate.

Depending on the actual requirements of the device, the substrate can be selected from such as silicon substrate, germanium (Ge) substrate, SiGe substrate, silicon-on-insulator (SOI) substrate, or germanium-on-Insulator (GOI) substrate. In one preferred embodiment, as shown in FIG. 2, the substrate 100 is silicon substrate. The substrate can be divided into a CMOS device region C for forming MOS devices and a HBT device region H for forming HBT devices. FIG. 2 is for illustrative purpose, and the dividing way for CMOS device region C and the HBT device region H can be based on the integration requirements for the device.

Continue to refer to FIG. 2, an isolation device 101 is formed in the substrate 100. For example, a silicon nitride layer is firstly formed on the substrate 100, then a barrier layer and a stop layer are formed for subsequent etching and other processes, a photoresist is coated by spinning coating, and exposure and development are conducted to define the active area. The photoresist is removed. Dry etching is conducted to the substrate 100 by using the above silicon nitride layer as hard mask to form shallow trenches. After the formation of the shallow trenches, oxidation is conducted to form a thin layer of silica. The shallow trench isolation 101 is formed by filling silica in the shallow trench via CVD. Further, the filled silica can be subjected to rapid thermal annealing (RTA) to make it denser and repair damages of the substrate caused by the previous steps.

After the formation of the shallow trench isolation 101, a thermal oxide layer and a sacrificial oxide layer (not shown) are formed on the substrate to be the shielding layer to form the well region. The shielding layer is etched to define the scope of the well region. The doped ions are pushed into the silicon substrate via ion implantation. Then a rapid thermal annealing process is conducted to activate the doped ions and repair lattice damages caused by ion implantation. The above well region contains n-well region and p-well region.

Step S103: forming a collector region of a first conductivity type above the well region in the HBT device region.

In this example, an npn-type heterojunction bipolar transistor is formed, namely, the well region formed in HBT device region H is n-well region, and, n-type collector region is formed on above of the n-well region. The detail is described as follows.

Figure 3:
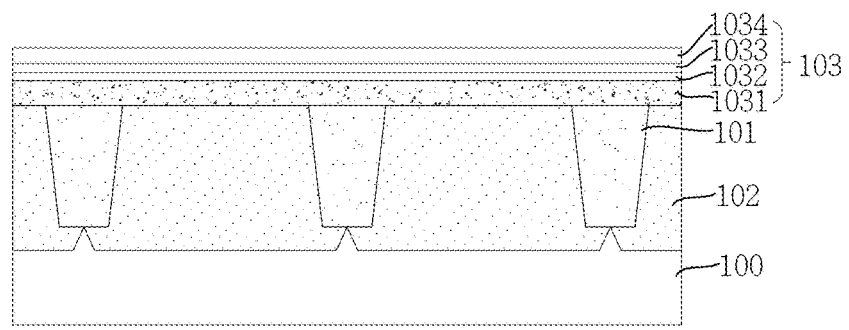
FIG. 3 shows a gate stack formed on the substrate surface prior to formation of a collector region.

Still referring FIG. 3, a gate stack 103 is formed on the substrate surface. For example, the thermal oxide layer and the sacrificial oxide layer are removed; the substrate surface is washed; a thermal oxidation is conducted to form a first gate oxide layer on the substrate surface; a partial surface of the first gate oxide layer and the silicon substrate is removed by wet etching; a second thermal oxidation is conducted to the core device region to form a second gate oxide layer. Accordingly, the gate oxide layer 1031 is formed above the substrate. Then, a polysilicon layer 1032 and a hard mask are formed above the substrate via deposition, in which the hard mask contains a silicon oxynitride layer 1033 and a silicon dioxide layer 1034 formed sequentially.

The polysilicon layer 1032 and the gate oxide layer 1031 of the gate stack 103 with the existence of the hard mask containing the silicon oxynitride layer 1033 and the silicon dioxide layer 1034 is etched until exposure of the substrate surface. A collector region window 1040 is formed therefore. In the collector region window, a collector region 104 is formed by selective silicon epitaxy growth. In this example, the collector region 104 is non-doped monocrystalline or polycrystalline silicon.

Figure 4:
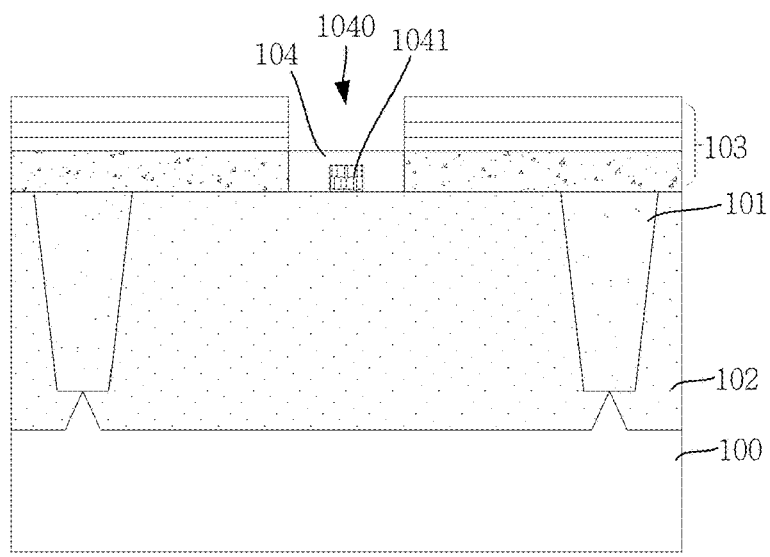
FIG. 4 shows a structure of the collector region formed above the HBT device region.

Referring FIG. 4, after the formation of the collector region 104, a N-type self-aligned doped collector region 1041 (self-aligned collector implant, SCI) is formed in the collector region 104 by selective doping to the collector region. In one embodiment, the above SCI can be formed by doping of phosphorus (P) ions to the collector region 104.

Step S104: forming an intrinsic base region of a second conductivity type above the collector region.

Figure 5:
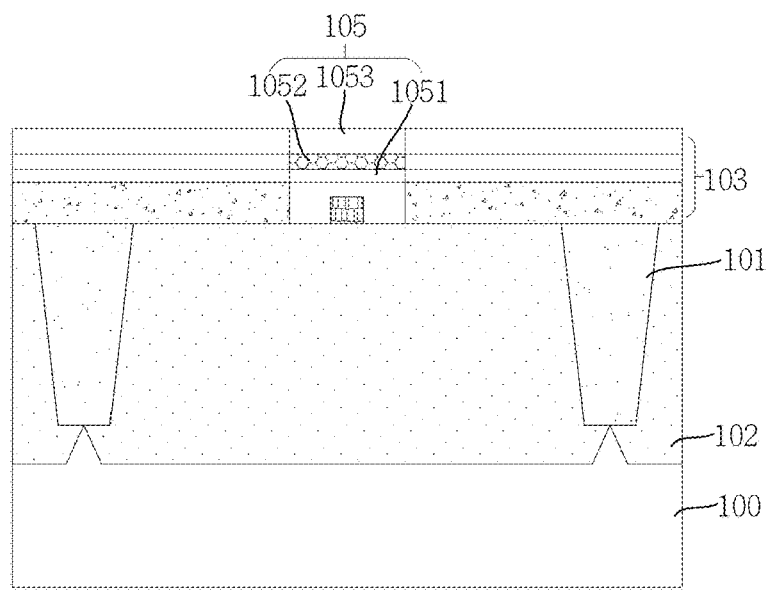
FIG. 5 shows a structure of the formed intrinsic base region.

Referring FIG. 5, after the formation of the SIC, an intrinsic base region 105 is formed by non-selective epitaxy growth in the collector region window 1040. In this example, the intrinsic base region is formed by the P-type semiconductor material. For example, a silicon buffer layer 1051 is formed by epitaxy growth, a SiGe epitaxial layer 1052 is formed, and the SiGe epitaxial layer is in-situ doped with carbon to form the SiGe:C layer. In one embodiment, boron (B) can be doped simultaneously. A silicon cap layer 1053 is formed above the SiGe epitaxial layer 1052. Accordingly, the formed intrinsic base region 105 comprises, the SiGe:C layer, a content ratio of Ge of about 10-15% and a content ratio of C of about 1-5%.

Step S105: forming an emitter region of the first conductivity type above the intrinsic base region.

Figure 6:
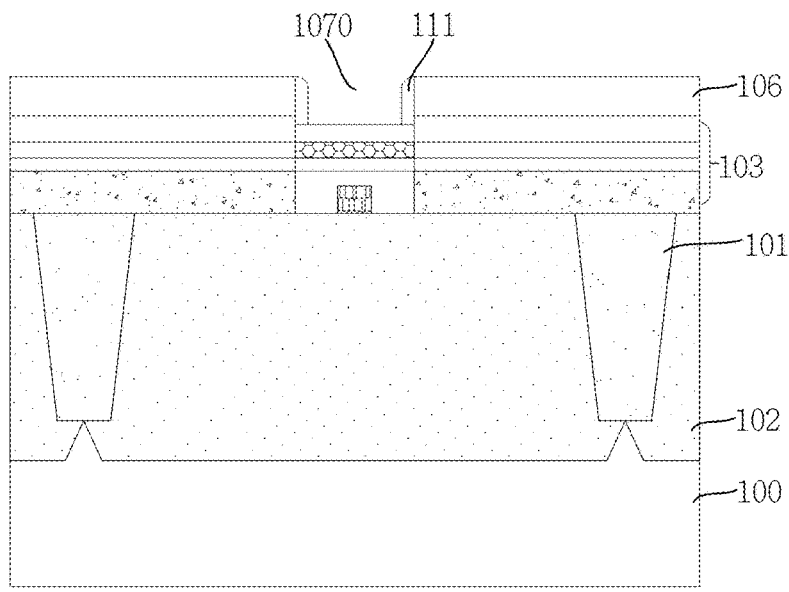
FIG. 6 shows a structure of the emitter region window formed above the intrinsic base region.
Figure 7:
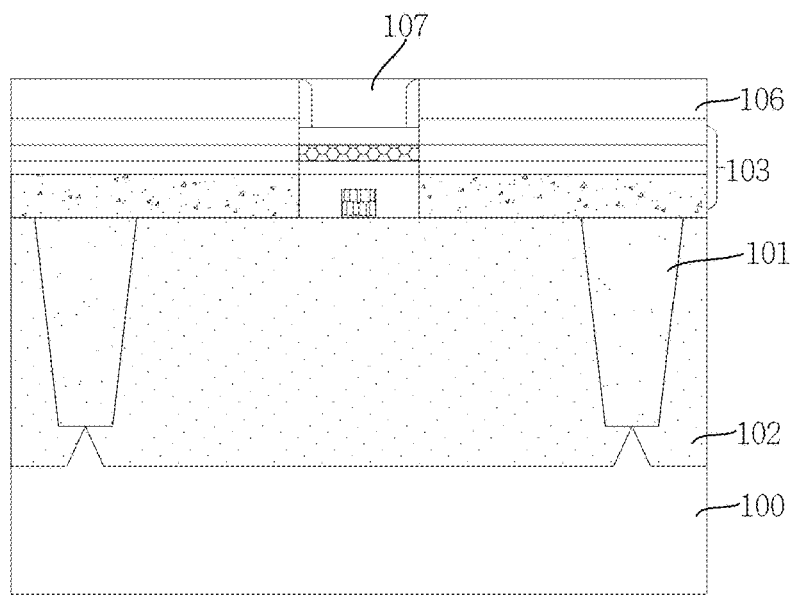
FIG. 7 shows a structure comprising the emitter region.

As shown in FIG. 6, a hard mask layer 106 is formed above the structure of FIG. 5. The rigid mask layer 106 is etched to expose the silicon cap layer of the intrinsic base region to form an opening. In another embodiment, the etching process can be stopped while a partial of the silicon cap layer is removed to form the opening. Then a partition wall 111 is formed on the side wall of the opening to form an emitter region window 1070. Then, as shown in FIG. 7, an emitter region 107 is formed in the emitter region window by silicon epitaxy growth. In this example, an emitter region 107 is formed by n-type doped epitaxial silicon such as arsenic (As) doped polysilicon. The emitter region has a height of 10 nm-30 nm.

Step S106; forming a raised extrinsic base region of the second conductivity type on both sides of the emitter region, wherein the extrinsic base region contains a graphene region formed therein.

Figure 8:
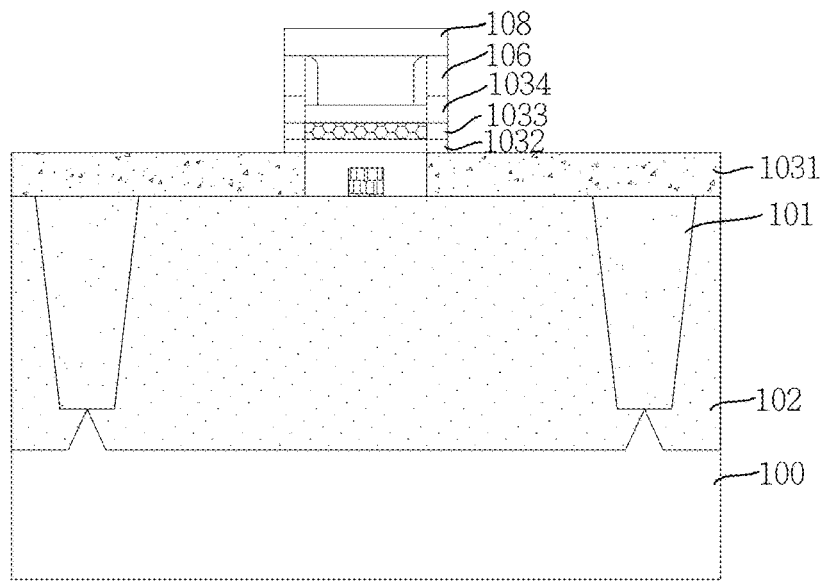
FIG. 8 shows a structure that the structure of FIG. 7 is etched to expose the oxygen-contained layer.
Figure 9:
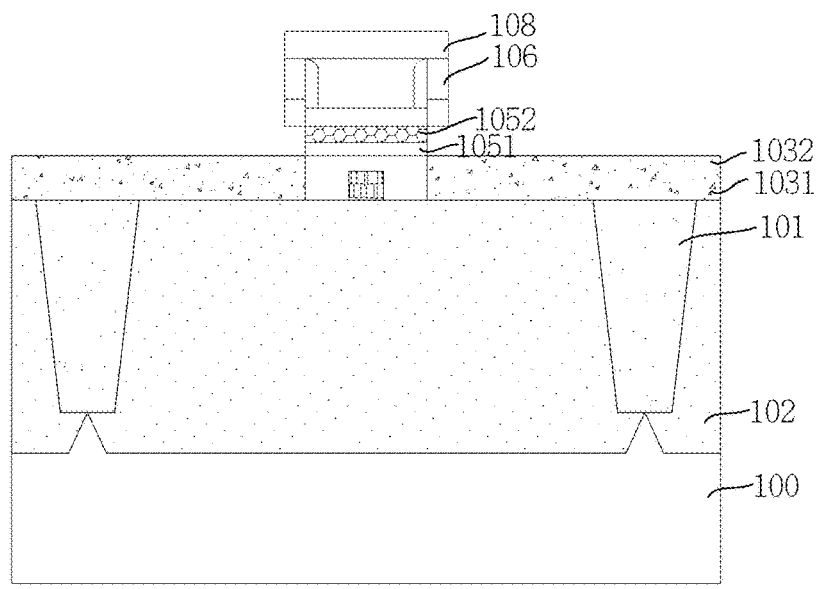
FIG. 9 shows a structure that the rigid mask in the gate stack shown in FIG. 8 is etched to expose the intrinsic base region.
Figure 10:
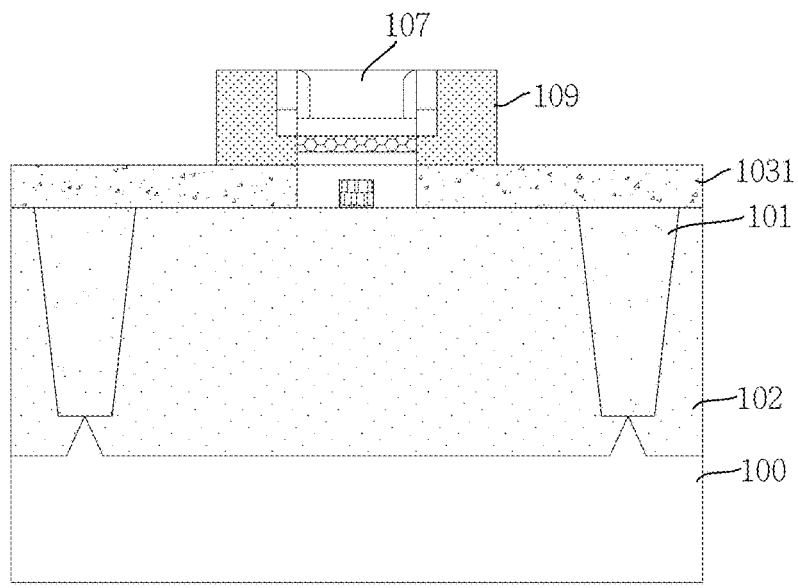
FIG. 10 shows a structure comprising the formed raised non-intrinsic base region.

As shown in FIG. 8, an oxide layer 108 is formed above the structure of FIG. 7 to cover the emitter region. Under the shielding of the oxide layer 108, an etching process is conducted to expose the gate oxide layer 1031. Then, as shown in FIG. 9, the rigid mask in the gate stack removed by wet etching, namely, the silicon dioxide layer 1034 and the silicon oxynitride layer 1033 are removed sequentially to expose the silicon buffer layer 1051 and the SiGe layer 1052 in the intrinsic base region. Then, as shown in FIG. 10, a selective epitaxial silicon growth is conducted to form a raised silicon epitaxial structure. In-situ heavy doping of carbon (C) and boron (B) is conducted to the silicon epitaxial structure, and a metal catalyst is doped simultaneously. A plasma treatment to the doped carbon and an annealing are conducted to form the graphene region in the silicon epitaxial structure. Finally, the raised non-intrinsic base region 109 is formed from the silicon epitaxial structure containing the graphene region. In one embodiment, in the silicon epitaxial structure, the carbon has a doping concentration less than 10%, the boron has a doping concentration less than 5%, the metal catalyst can be titanium (Ti) or zirconium (Zr), and the metal catalyst has a concentration less than 3%. In one embodiment, after the plasma treatment to the doped carbon, the laser annealing temperature is higher than 700° C. to form the graphene region in the silicon epitaxial structure.

Because of highly conductive graphene, the base resistance of the SiGe HBT can be reduced to enhance its performance at high operation frequency.

Figure 11:
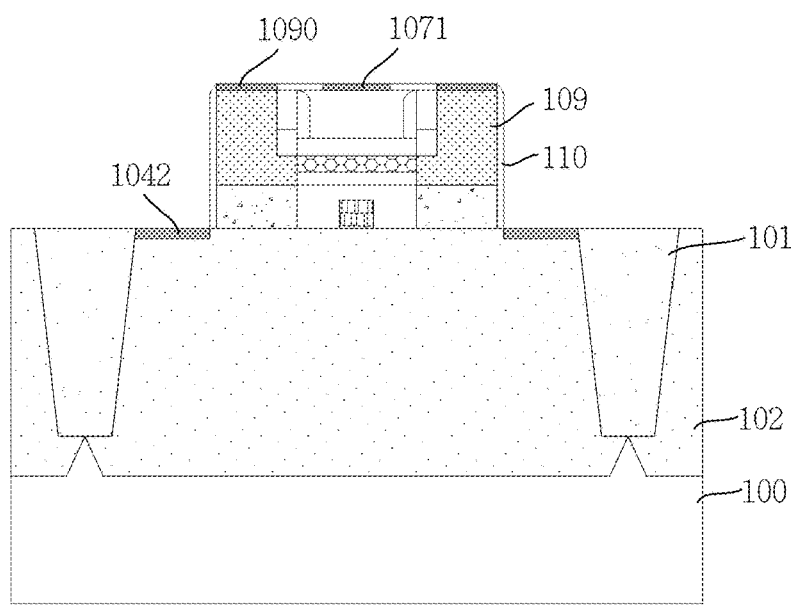
FIG. 11 shows a structure after the formation of the emitter region contact, the base contact, and the collector region contact in the structure of FIG. 10.

After formation of the above emitter region, the extrinsic base region, and the collector region, as shown in FIG. 11, the gate oxide layer 1031 on the substrate surface is removed, and a dielectric layer 110 is formed on the surface and the side walls of the device. Then, in parts of the dielectric layer corresponding to the emitter region, extrinsic base region and collector region, the metal layer or metal silicide layer is formed by etching, deposition and the like. Accordingly, an emitter region contact 1071, a base region contact 1090 and a collector region contact 1042 are formed.

After formation of the above HBT device, the step of forming a MOS device above the substrate corresponding to the CMOS device region C is further comprised. For example, the polysilicon in the gate stack above the CMOS device region C is patterned to form the polysilicon covering the trenches, and a spacer layer is formed on the polysilicon side wall. Under the action of the spacer layer, halo doping is conducted to the fin to form an n-type or p-type doping region. Then, the epitaxial SiGe is formed on the both silicon side walls, and the p-type source region and drain region are formed by conducting in situ doping or p-type heavy doping. Or, alternatively, the epitaxial silicon is formed on the both side walls of the polysilicon, and the n-type source region and drain region are formed by conducting in situ doping or n-type heavy doping. Deposition of interlayered dielectric layer and planarization are conducted to expose the polysilicon. The exposed polysilicon is removed to form an opening for the gate. A high-k gate dielectric layer is deposed in the opening. The work function metal layers applied for nMOS or pMOS devices is respectively formed above the gate dielectric layer, and finally a gate metal layer is formed. Then, the source, drain, and gate are formed separately.

In this embodiment, the npn-type heterojunction bipolar transistor is formed, so that the method for forming a heterojunction bipolar transistor in the BiCMOS process is described in detail. It should be understood that the method can be applied to form a pnp type heterojunction bipolar transistor.

As described above, in this embodiment, the method comprises doping C and B in situ to the silicon epitaxial layer; doping a metal catalyst simultaneously; conducting a plasma treatment to the doped carbon; conducting a laser annealing to the doped silicon layer; forming a graphene region in the silicon epitaxial layer; and forming an extrinsic base region containing a graphene region.

Because of high conductivity of graphene, the base resistance of the SiGe HBT can be reduced to enhance its performance at high operation frequency. The above method is based on the conventional BiCMOS device process, and can be applied to form the graphene region within the extrinsic base region by conducting the plasma treatment to the doped carbon and the laser annealing. It is easy to control the above method and incorporate the above method into the conventional BiCMOS device process The above method is easily to be incorporated into the FinFET technical platform, and can be well practiced. The formed heterojunction bipolar transistor has excellent electrical properties.

Example 2

This example provides a BiCMOS device. Also referring FIG. 2 to FIG. 11, the heterojunction bipolar transistor comprising: a substrate comprising a CMOS device region and a HBT device region; well regions formed in the substrate, wherein the neighboring well regions are isolated by a shallow trench; and a heterojunction bipolar transistor formed in the HBT device region.

The substrate 100 can include such as silicon substrate, Ge substrate, SiGe substrate, SOI substrate, GOI substrate and the like. In one preferred embodiment, as shown in FIG. 2, the substrate 100 is silicon substrate. The substrate can be divided into a CMOS device region C for forming MOS devices and a HBT device region H for forming HBT devices. FIG. 2 is for illustrative purpose, and the dividing way for CMOS device region C and the HBT device region H can be based on the integration requirements for the device.

As shown in FIG. 2 and FIG. 11, the well regions 102 are formed in the substrate 100. The well regions 102 can be formed by ion implementation, in which the doped ions can be pushed into the silicon substrate to form the well regions. The above well regions contain n-well and p-well regions. Among the well regions, the well region 102 used as collector region is formed. In this example, the well region 102 is n-type doped well region.

Regarding the heterojunction bipolar transistor formed in the HBT device region, the npn-type heterojunction bipolar transistor is formed in this example, and the well region formed in the HBT device region H in the substrate is n-type well region. The heterojunction bipolar transistor comprises: a collector region of a first conductivity type located above the well region of the HBT device region; an intrinsic base region of a second conductivity type located above the collector region; an emitter region of the first conductivity type located above the intrinsic base region; and a raised extrinsic base region of the first conductivity type on both sides of the emitter region, wherein the non-intrinsic base region contains a graphene region formed therein.

In this example, the collector region 104 is n-type collector region, and the n-type self-aligned doped collector region 1041 (SCI: self-aligned collector implant) is formed therein. In one embodiment, the above SCI can be formed by doping of phosphorus (P31) ions to the collector region 104.

The intrinsic base region 105 is p-type intrinsic base region, which comprises the silicon buffer layer 1051, the SiGe epitaxial layer 1052, and the silicon cap layer 1053 located above the SiGe epitaxial layer 1052. The SiGe epitaxial layer is doped with carbon (C) ions and the SiGe:C layer can be formed. In one embodiment, the SiGe layer can be doped with boron (B) simultaneously. Accordingly, in the SiGe:C layer, the content ratio of Ge is about 10-15% and the content ratio of C is about 1-5%.

In this example, the emitter region 107 is formed by n-type doped epitaxial silicon such as arsenic (As) doped polysilicon. The emitter region has a height of 10 nm-30 nm.

The raised first conductivity type extrinsic base region locates on both sides of the emitter region, wherein the extrinsic base region contains a graphene region formed therein. The graphene region in the extrinsic base region 109 can be formed by conducting the heavy doping of carbon (C) and boron (B) in situ in the epitaxial structure, doping the metal catalyst simultaneously, performing the plasma treatment to the doped carbon (C), and annealing. In one embodiment, in the silicon epitaxial structure, the carbon has a doping concentration less than 10%, the boron has a doping concentration less than 5%, the metal catalyst is titanium (Ti) or zirconium (Zr), and the metal catalyst has a doping concentration less than 3%. After the plasma treatment, the laser annealing is conducted under a temperature higher than 700° C. to form the graphene region in the silicon epitaxial structure.

Further, in the BiCMOS of this example, the CMOS device region has a MOS device formed therein. The MOS device comprises nMOS and/or pMOS device. The MOS device comprises the trench region formed in the well region of the CMOS device region C, and the source region and the drain region located on two sides of the trench region. The gate structure is formed on outer layer of the trench region. The source and the drain is respectively formed on outer side of the source region and the drain region.

In this example, the npn-type heterojunction bipolar transistor is applied as the embodiment to be described. It should be understood that the heterojunction bipolar transistor can be pnp-type heterojunction bipolar transistor.

As described above, the method for manufacturing the BiCMOS and the heterojunction bipolar transistor formed therein has at least advantages shown as follows.

In the present application, the formation of the raised extrinsic base region containing a graphene region comprises doping carbon (C) and boron (B) in situ to the epitaxial silicon; doping the metal catalyst simultaneously; performing the plasma treatment to the doped carbon; and performing the laser annealing. Therefore, the graphene region is formed in the Si epitaxial layer. Because of highly conductive graphene, the base resistance of the SiGe HBT can be reduced to enhance its performance at high operation frequency. The above method is based on the conventional BiCMOS device process, and can be applied to form the graphene region within the extrinsic base region by performing the plasma treatment to the doped carbon and the laser annealing. It is easy to control the above method and incorporate the above method into the conventional BiCMOS device process The heterojunction bipolar transistor in the extrinsic base region formed by the above method contains the graphene regions with high conductivity, resulting in smaller base resistance. Therefore, the heterojunction bipolar transistor has enhanced performance at high operation frequency.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method for manufacturing a heterojunction bipolar transistor (HBT) in bipolar complementary metal oxide semiconductor (BiCMOS) device comprising the following steps:
    providing a substrate comprising a CMOS device region and a HBT device region;
    forming well regions in the substrate, wherein the neighboring well regions are isolated by a shallow trench;
    forming a collector region of a first conductivity type above the well region of a first conductivity type in the HBT device region;
    forming an intrinsic base region of a second conductivity type above the collector region;
    forming an emitter region of the first conductivity type above the intrinsic base region; and
    forming a raised extrinsic base region of the second conductivity type on both sides of the emitter region, wherein the extrinsic base region contains graphene regions formed therein, and
    wherein the step of forming the raised extrinsic base region of the second conductivity type on both sides of the emitter region comprises the following step:
    performing a selective epitaxial silicon growth on both sides of the emitter region;
    doping carbon (C) and boron (B) to the silicon layer;
    performing a plasma treatment to the doped carbon;
    performing a laser annealing to the doped silicon layer; and
    forming the graphene regions in the silicon layer.

2. The method of claim 1, wherein the step of forming the collector region of the first conductivity type above the well region in the HBT device region further comprises the following steps:
    etching a hard mask layer on a surface of the substrate in the HBT device region to form the collector region window;
    forming an epitaxial silicon layer in the collector region window;
    forming an ion implantation window above the epitaxial silicon layer; and
    performing n-type ion implantation into the epitaxial silicon layer via the ion implantation window to form a self-aligned doped collector region.

3. The method of claim 1, wherein the step of forming the emitter region of the first conductive type above the intrinsic base region further comprises the following steps:
    forming a mask layer above the intrinsic base region;
    patterning the mask layer to form an emitter region window; and
    performing an epitaxial growth of doped silicon via the emitter region window to form the emitter region.

4. The method of claim 3, wherein the step of conducting an epitaxial growth of doped silicon via the emitter region window further comprises: conducting in-situ arsenic (As) doping.

5. The method of claim 1, wherein the step of forming the intrinsic base region above the collector region comprises:
    forming a silicon buffer layer and a silicon-germanium (SiGe) layer above the collector region;
    performing carbon (C) doping and boron (B) doping to the SiGe layer; and
    forming a silicon cap layer above the SiGe layer.

6. The method of claim 1, wherein the silicon layer is also doped with a metal catalyst while the silicon layer is doped with carbon (C) and boron (B).

7. The method of claim 1, wherein the carbon has a doping concentration less than 10% and the boron has a doping concentration less than 5%.

8. The method of claim 1, wherein the metal catalyst is titanium (Ti) or zirconium (Zr), and the metal catalyst has concentration less than 3%.

9. The method of claim 1, wherein the laser annealing temperature is higher than 700° C.

10. The method of claim 1, wherein the CMOS device region has a MOS device formed therein.

11. A BiCMOS device comprising:
    a substrate comprising a CMOS device region and a HBT device region;
    well regions formed in the substrate, wherein the neighboring well regions are isolated by a shallow trench;

a heterojunction bipolar transistor (HBT) formed in the HBT device region, wherein the heterojunction bipolar transistor comprises:
   a collector region of a first conductivity type located above the well region of the HBT device region;
   an intrinsic base region of a second conductivity type located above the collector region;
   an emitter region of the first conductivity type located above the intrinsic base region;
   a raised extrinsic base region of the second conductivity type on both sides of the emitter region, wherein the extrinsic base region contains graphene regions formed therein; and
   wherein the raised extrinsic base region of the second conductivity type comprises an epitaxial silicon layer doped with carbon (C) and boron (B) and the graphene regions is formed in the silicon layer.

12. The BiCMOS device of claim 11, wherein the collector region comprises an epitaxial silicon layer and a self-aligned doped collector region formed in the epitaxial silicon layer.

13. The BiCMOS device of claim 11, wherein the intrinsic base region comprises a silicon buffer layer, a carbon-doped SiGe layer and a silicon cap layer formed above the collector region.

14. The BiCMOS device of claim 11, wherein the emitter region is As-doped silicon layer.

15. The BiCMOS device of claim 11, wherein the CMOS device region has a MOS device formed therein.

* * * * *